United States Patent
Corrigan (10) Patent No.: US 12,133,050 B2
(45) Date of Patent: Oct. 29, 2024

(54) DEVICE FOR SENSING A MOTION OF A DEFLECTIVE SURFACE

(71) Applicant: Infineon Technologies AG, Neubiberg (DE)

(72) Inventor: Darragh Francis Corrigan, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/931,965

(22) Filed: May 14, 2020

(65) Prior Publication Data

US 2020/0404430 A1     Dec. 24, 2020

(30) Foreign Application Priority Data

Jun. 19, 2019    (EP) .................................... 19181357

(51) Int. Cl.
*H04R 23/00*     (2006.01)
*B81B 3/00*      (2006.01)
(Continued)

(52) U.S. Cl.
CPC .......... *H04R 23/008* (2013.01); *G01H 9/008* (2013.01); *B81B 3/0083* (2013.01); *B81B 2201/0264* (2013.01); *B81B 2201/047* (2013.01); *B81C 1/00158* (2013.01); *G01H 9/004* (2013.01); *G01S 3/80* (2013.01); *G02B 5/1814* (2013.01);
(Continued)

(58) Field of Classification Search
CPC ........................ H04R 23/008; H04R 2410/00; H04R 31/003; H04R 2201/003; H04R 2207/021; G01H 9/009; G01H 9/004; B81B 3/0083; B81B 2201/0264; B81B 2201/047; B81C 1/00158; G02B 5/1814; G02B 27/42; G01L 9/0076; G01L 9/0079
See application file for complete search history.

(56) References Cited

U.S. PATENT DOCUMENTS 5,995,260 A *  11/1999  Rabe .................... H04R 23/008
                                                          398/115
7,134,343 B2 *  11/2006  Suzuki .................... G01H 9/00
                                                          73/649
(Continued)

FOREIGN PATENT DOCUMENTS

EP            1500913 A2     1/2005
WO     WO-2012160729 A1 *  11/2012  ............. G01N 21/01
(Continued)

*Primary Examiner* — Carolyn R Edwards
*Assistant Examiner* — Kuassi A Ganmavo
(74) *Attorney, Agent, or Firm* — Slater Matsil, LLP (57) ABSTRACT

A device for sensing a motion of a deflectable surface includes a deflectable element having a first side beam deflectable and includes a reflective surface at a second side of the deflectable element, proposing the first side. The device includes an optical emitter for emitting an optical signal towards the reflective surface and an optical receiver for receiving a reflected optical signal from the reflective surface and for providing a reception signal based on a reflective optical signal. The device includes a control unit in communication with the optical receiver for determining information related to the motion of the deflectable element based on the reception signal.

20 Claims, 3 Drawing Sheets

(51) Int. Cl.
  *B81C 1/00* (2006.01)
  *G01H 9/00* (2006.01)
  *G01S 3/80* (2006.01)
  *G02B 5/18* (2006.01)
  *G02B 27/42* (2006.01)
  *G06F 3/042* (2006.01)
  *G10L 15/22* (2006.01)
  *G10L 25/78* (2013.01)
  *H01H 1/00* (2006.01)

(52) U.S. Cl.
  CPC .......... *G02B 27/42* (2013.01); *G02B 27/4233* (2013.01); *G06F 3/042* (2013.01); *G10L 15/22* (2013.01); *G10L 25/78* (2013.01); *H01H 1/0036* (2013.01); *H04R 2410/00* (2013.01)

(56) References Cited

U.S. PATENT DOCUMENTS

| | | | | |
|---|---|---|---|---|
| 7,355,720 B1* | 4/2008 | Carr | ...................... | G01H 9/004 356/498 |
| 8,074,501 B2* | 12/2011 | Kummer | ............... | G01L 9/0077 73/114.19 |
| 10,034,109 B2* | 7/2018 | Russell | ................ | H04R 29/003 |
| 10,514,249 B2 | 12/2019 | Lacolle et al. | | |
| 2002/0039463 A1 | 4/2002 | Degertekin et al. | | |
| 2003/0002129 A1* | 1/2003 | Kobayashi | ............. | H04R 23/00 359/285 |
| 2004/0067005 A1* | 4/2004 | Miyazawa | ........... | H04R 23/008 385/13 |
| 2004/0130728 A1* | 7/2004 | Degertekin | .......... | G01B 11/026 356/505 |
| 2005/0052724 A1* | 3/2005 | Suzuki | ................... | G01H 9/00 359/305 |
| 2005/0163509 A1* | 7/2005 | Kobayashi | ........... | H04R 23/008 398/132 |
| 2005/0238188 A1* | 10/2005 | Wilcox | ................. | H04R 23/008 381/172 |
| 2006/0181712 A1 | 8/2006 | Degertekin et al. | | |
| 2007/0279640 A1* | 12/2007 | Carr | ....................... | G01L 9/0079 356/519 |
| 2008/0180399 A1* | 7/2008 | Cheng | .................... | G06F 3/045 345/173 |
| 2009/0025480 A1* | 1/2009 | Aharoni | ................... | G01H 9/00 73/655 |
| 2012/0277631 A1* | 11/2012 | Maity | .................. | G01B 11/026 600/587 |
| 2012/0306823 A1* | 12/2012 | Pance | .................... | H04R 1/028 345/177 |
| 2014/0183585 A1* | 7/2014 | Gubser | ............. | H01L 31/02325 438/69 |
| 2015/0293243 A1* | 10/2015 | Avenson | .................. | G01H 9/00 73/1.85 |
| 2015/0323456 A1* | 11/2015 | Agashe | .................. | G01N 21/01 356/445 |
| 2016/0007125 A1* | 1/2016 | Lee | ....................... | H04R 31/003 29/896.2 |
| 2016/0026340 A1 | 1/2016 | Dahl et al. | | |
| 2016/0219375 A1 | 7/2016 | Hall et al. | | |
| 2016/0219378 A1* | 7/2016 | Hall | ....................... | H04R 19/04 |
| 2016/0221822 A1* | 8/2016 | Krumbein | ........... | H04R 19/005 |
| 2016/0238855 A1* | 8/2016 | Kriman | ................ | G02B 5/1857 |
| 2016/0259098 A1* | 9/2016 | Sasai | .................... | G02B 5/1857 |
| 2017/0289703 A1* | 10/2017 | Bartl | ...................... | G02B 27/4233 |
| 2018/0075867 A1* | 3/2018 | Dahl | ....................... | G10L 15/22 |
| 2018/0235483 A1* | 8/2018 | Mouradian | ........... | G04G 21/00 |
| 2020/0212136 A1* | 7/2020 | Ha | ........................ | G06F 1/1605 |
| 2021/0271338 A1* | 9/2021 | Dahl | ........................ | G01H 9/00 |
| 2022/0167096 A1* | 5/2022 | LaColle | ................. | H04R 23/008 |

FOREIGN PATENT DOCUMENTS

| | | | | |
|---|---|---|---|---|
| WO | WO-2014012189 A1 * | 1/2014 | .......... | D01H 13/165 |
| WO | 2014202753 A1 | 12/2014 | | |
| WO | 2018211281 A1 | 11/2018 | | |

\* cited by examiner

DEVICE FOR SENSING A MOTION OF A DEFLECTIVE SURFACE

This application claims the benefit of European Patent Application No. 19181357, filed on Jun. 19, 2019, which application is hereby incorporated herein by reference.

TECHNICAL FIELD

The present disclosure relates to a device for sensing a motion of a deflective surface. The present disclosure further relates to detecting acoustic signals without a sound port.

BACKGROUND

Acoustic signals may be sensed or detected by use of microphone structures that comprise a membrane which is deflected responsive to an acoustic signal. Such membranes may be sensed by use of electrostatic evaluation. That is, a variance in capacitance and/or electric voltage may be correlated with a movement of the membrane. Such microphone structures may be arranged inside a housing or case and may be connected to an outside volume via a sound port. Embodiments further relate to a method of detected acoustic signals in a mobile telephone.

It is desirable to provide for a device for sensing a motion of a deflectable surface that is incapable of precisely detecting the motion of the deflective surface.

This object is achieved by the subject-matter as defined in the independent claim.

SUMMARY

According to an embodiment a device for sensing a motion of a deflectable surface comprises a deflectable element having a first side being deflectable and comprising a reflective surface at a second side of the deflectable element opposing the first side. The device comprises an optical emitter configured for imaging an optical signal towards the reflective surface. The device comprises an optical receiver configured for receiving a reflected optical signal from the reflective surface and for providing a reception signal based on the reflected optical signal. The device comprises a control unit in communication with the optical receiver and configured for determining information related to the motion of the deflectable element based on the reception signal. This allows for obtaining a precise evaluation of the movement of the deflectable surface.

Further embodiments are defined in the dependent claims.

BRIEF DESCRIPTION OF THE DRAWINGS

Embodiments in accordance with the present disclosure are described herein after whilst making reference to the accompanying drawings in which.

DETAILED DESCRIPTION OF ILLUSTRATIVE EMBODIMENTS

Equal or equivalent elements or elements with equal or equivalent functionality are denoted in the following description by equal or equivalent reference numerals even if occurring in different figures.

In the following description, a plurality of details is set forth to provide a more thorough explanation of embodiments of the present invention. However, it will be apparent to those skilled in the art that embodiments of the present invention may be practiced without these specific details. In other instances, well known structures and devices are shown in block diagram form rather than in detail in order to avoid obscuring embodiments of the present invention. In addition, features of the different embodiments described hereinafter may be combined with each other, unless specifically noted otherwise.

Embodiments described herein relate to a deflectable element that has a deflectable first side and a reflective surface at a second side. Some of the embodiments described herein relate to a single structure, for example, a plate structure or a film structure which may have two opposing sides, one of them being deflectable responsive, for example, to an external force, for example, a static or dynamic pressure, a vibration or the like, and the other, opposing side being reflective or having a reflective coating or the like. However, embodiments are not limited hereto. The deflectable element may be a multi-component or a multi-layer structure in which different layers or elements are mechanically fixed by elastic or rigid components. Such multi-layer or multi-component structures allow to transport a deflection received at the first side to a reflective surface at the second side. An example for such a multi-component structure may be a touch display mounted to a tablet computer or smart phone or the like. A glass plate of the screen may be deflected responsive to the external force whilst an opposing side which is arranged at an interior of the device may carry the reflective surface. That is, the deflectable element may be a single-component or multi-component structure.

Figure 1:
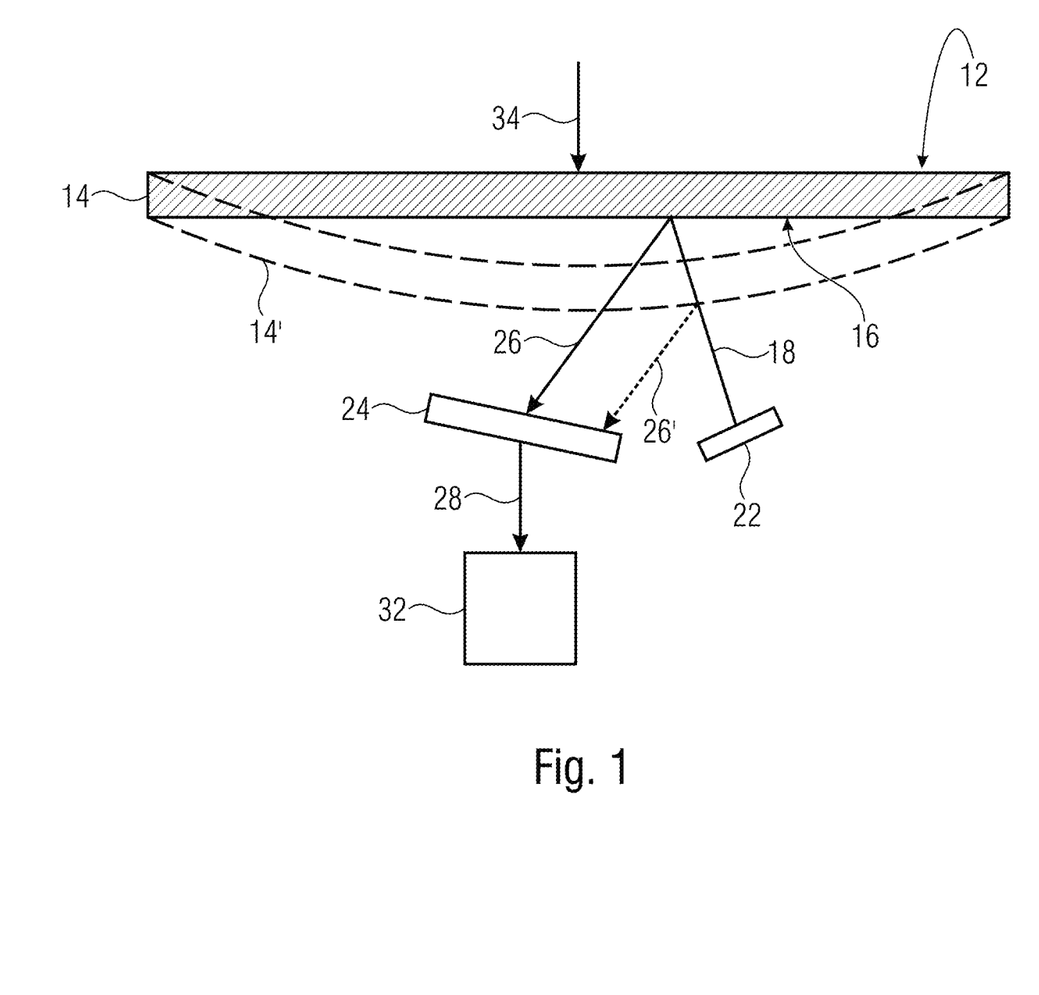
FIG. 1 shows a schematic block diagram of a device according to an embodiment.

FIG. 1 shows a schematic block diagram of a device 10 according to an embodiment. The device 10 is adopted for sensing a motion of a deflectable surface 12. The device 10 comprises a deflectable element 14 which may be a single-component or multi-component structure, having arranged at a first side the deflectable surface 12. A second side 16 opposing the deflectable surface 12 may be a reflective surface. For example, a reflective coating may be arranged at the second side. Such a reflective coating may be obtained, for example, by arranging a metal layer such as gold, silver, aluminum or the like. Alternatively or in addition, other reflective materials may be arranged, for example, a glass material. Reflectivity is to be understood in view of an optical signal 18 which may be generated or admitted by an optical emitter 22 so as to be reflected at the reflective surface 16. That is, although being reflective, at least in part, in a wavelength range of the optical signal 18, the reflective surface 16 may be absorbing or transparent in different wavelength ranges. For example, when using a laser as a source for the optical signal 18, same may provide the optical signal at a single wavelength, i.e., a narrow wavelength range that may be arranged in the region of 100 nm to 1,000 nm. The reflective surface may be at least partially or completely reflective in the band of the optical signal, whilst it may be transparent outside of this band.

The optical emitter 22 is configured for emitting the optical signal 18 towards the reflective surface 16. The device 10 may comprise an optical receiver 24. The optical receiver 24 may be configured for receiving a reflected optical signal 26 from the reflective surface 16. The optical receiver 24 may be configured for providing a reception signal 28 based on the reflected optical signal 26. For example, the reception signal 28 may indicate a wavelength range, an intensity and/or a position of the reflected optical signal 26 received with the optical receiver 24. The optical receiver 24 may comprise, for example, one or more imaging elements or pixels configured for converging the reflected optical signal 26 into the reception signal 28 which may be, for example, an electrical or optical signal.

The device 10 may comprise a control unit 32 in communication with the optical receiver 24. The control unit 32 may receive the reception signal 28 from the optical receiver 24 and/or may be configured for determining information related to a motion of the deflectable element 14 based on the reception signal 28.

An evaluation of the reflected optical signal 26 or 26' may be obtained in different ways. For example, a Time of Flight (ToF), a location and/or a pattern of the reflected optical signal 26/26' at the optical receiver 24 may be evaluated.

For example, solid lines indicate an undeflected state of the deflectable element 14 whilst dashed lines indicate a deflected state 14'. In the deflected state 14' a reflected optical signal 26' may differ when compared to the reflected optical signal 26 being based on the undeflected state. This difference may be evaluated by use of the reception signal 28 such that the control unit 32 may gather information related to the deflection or motion of the deflectable element 14 based on the reception signal 28.

The device 10 may comprise elements to evaluate the deflection or motion and the respective deflectable element 14 together in one device.

The deflectable element 14 may be deflectable based on a force 34. The force 34 may be a static and/or dynamic force. For example, the device 10 may be a weighting device such that the element 14 is configured to be loaded with a mass or weight leading to the deflection of the deflectable element 14. That is, the device 10 may be adapted as a force sensor.

Alternatively or in addition, the deflectable element 14 may be implemented such that the deflectable surface 12 or the first side of the deflectable element 14 is deflected based on an acoustic signal. The control unit 32 may be configured for determining the information related to the motion of the deflectable surface 12 so as to relate to the acoustic signal, the force 34 may be an acoustic signal. Such a configuration allows to determine the acoustic signal by evaluating the deflection of the deflectable surface 12 through optical measurements. This may allow to substitute an evaluation of a membrane structure. For example, the deflectable element 14 may be part of a housing of the device 10, for example, a part of a case and/or at least a part of a screen of the device 10. The reflective surface 16 may be arranged at an inner surface of the housing. In connection with the control unit 32 being configured for evaluating the reception signal 28 in view of acoustic components, this may allow to use the reflective surface 16 as a part of an optical microphone comprising the optical emitter 22, the optical receiver 24 and the reflective surface 16. The deflectable element 14 may implement an optical sound port of the device 10. According to an embodiment, the optical sound port may substitute a hole in a casing of the device, e.g., a classical sound port.

Figure 2:
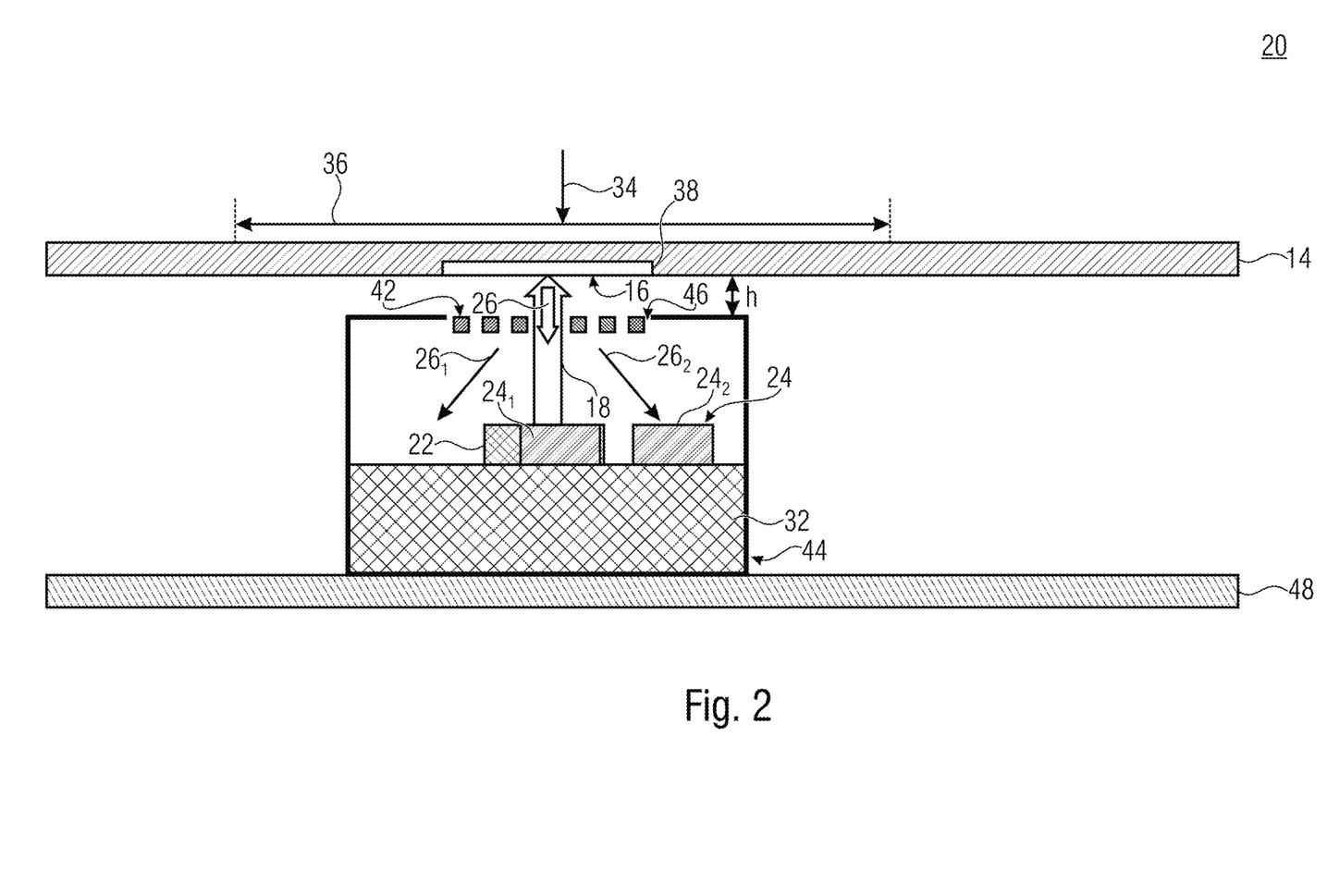
FIG. 2 shows a schematic side view of a part of a device according to an embodiment comprising a package having an optical emitter and an optical receiver, the package arranged at a substrate.

FIG. 2 shows a schematic side view of a part of a device 20 according to an embodiment. The deflectable element 14 may be implemented as, for example, as a screen, for example, of a smart phone or the like. The deflectable element 14 may be deflectable or vibratable at least in a vibrating area 36. That is, responsive to the force 34, for example, an acoustic signal, the deflectable element 14 deflects or vibrates at least in the vibrating area 36. The vibrating area 36 may be spaced apart from lateral or circumferential hinges or fixtures and may be, for example, arranged in a center portion of the screen. The vibrating area may be an area comprising or facing a maximum displacement of the reflective surface when same is vibrating. For example, this may be a central portion, wherein center relates to a center between hinges of the reflective surface or the body carrying the reflective surface and between hinges hinging this surface or body. At an inner side of the deflectable element 14, a reflective coating 38 may be arranged so as to provide for the reflective surface 16. That is, based on the force 34 the reflective surface 16 moves or vibrates accordingly.

The optical emitter 22 may comprise, for example, a broadband or narrowband source, e.g., a monochromatic source such as a vertical-cavity surface-emitting laser (VCSEL) or a different source of electromagnetic optical signals. According to an embodiment, the optical emitter 22 is configured for emitting a narrow-band optical signal, e.g., a monochromatic signal. This allows a precise use of a diffracting structure 42, for example, a diffraction grating arranged between the reflective surface 16 and the optical emitter 22 and/or between the reflective surface 16 and the optical receiver 24 comprising one or more receiving elements 241, 242, . . . , (24$i$) such as photodetectors, wherein the number of receiving elements 24$i$ may be one or more, two or more, five or more, ten or more, or any other arbitrary number. The more receiving elements arranged in a specific area, the more precisely a location of portions 261, 262 of the reflected optical signal 26 may be detected and determined. According to embodiment, the diffracting structure 42 is arranged between the reflective surface 16 and the optical receiver 24. This allows to diffract the reflected optical signal 26 so as to obtain one or more portions 26$i$ which may be detected with the receiving elements 24$j$. The portions 261 and/or 262 may be referred to as diffracted reflections obtained by the diffracting structure 42. A number of portions may be arbitrary and/or may form a common pattern. The reflected optical signal 26 may be diffracted, reflected and/or deflected with respect to the optical signal 18. The deflection may be obtained, for example, by use of the diffracting structure 42. Alternatively, other deflecting elements may be arranged, for example, a mirror, a lens or the like.

The control unit 32 may be implemented, for example, as an application specific integrated circuit (ASIC) connected to the receiving elements 24$j$ and optionally to the optical emitter 22 so as to control emission of the optical signal 18. Optionally, the controlled unit 32 may form a package 44 together with the optical emitter 22, the optical receiver 24 and optionally with the diffracting structure 42. For example, the diffracting structure 42 may be arranged in an optical section 46, for example, an opening or a section at least partially transparent for the optical signal 18 and/or the reflected optical signal 26, i.e., an optical passage 46 of the package 44. The optical emitter 22 may be configured for emitting the optical signal 18 through the optical section 46. The reflected optical signal 26 may enter the package 44 also through the optical section 46.

Forming the package 44 may allow to precisely arrange the elements 22, 24, 32 and 42 with respect to each other and to precisely position the entire package 44 with respect to other components, for example, to the reflective surface 16 and/or a substrate 48. The substrate 48 may be, for example, a printed circuit board (PCB) or a different element which may be static with regard to the vibratable reflective surface 16. The reflective surface 16 may be suspended vibratable with respect to the substrate 48 such that the reflective surface 16 may also be vibratable with respect to the package 44.

For example, the package 44 is attached or fixed directly or indirectly, e.g., via the substrate 48, at a backside of the case comprising the deflectable element 14. This may allow for a distance h between the reflective surface 16 and the diffracting structure 42 and/or between the reflective surface 16 and the optical emitter 22 and/or the optical receiver 24 to vary responsive to the force 34. In a vibration-less state, the distance h may be, for example, in a range of 0.1 to several micrometers, for example, 0.5 to 10 micrometers or approximately (+/−10%) 1 micrometer, allowing for a small size of the reflected pattern. Alternatively, other distances may be implemented.

A variation in the distance h may lead to a variation in a position at which the portions 261, 262, . . . are generated or obtained at the optical receiver 24. This variation in the location may be evaluated with the control unit 32 and associated or correlated with the force 34, e.g., the acoustic signal.

Although the package 44 is described as comprising the control unit 32, the optical emitter 22, the optical receiver 24 and the diffracting structure 42, a package in accordance with embodiments may comprise the optical emitter 22 and the optical receiver 24. In view of the evaluation of the reflected optical signal 26 the control unit 32 may be located at any different location. The diffracting structure 42 may be arranged fixed with respect to the optical emitter 22/optical receiver 24 or fixed with respect to the reflective surface 16.

According to the arrangement shown, the optical signal may travel twice through the diffracting structure 42, once along a first section from the optical emitter 22 to the reflective surface 16 and once when travelling from the reflective surface 16 to the optical receiver 24. Whilst it may be sufficient that the optical signal passes the diffracting structure or element 42 only once, e.g., from the reflective surface 16 to the optical emitter 24 so as to generate a two-dimensional pattern based on the reflected optical signal 26, the pattern represented by the two or more portions 26i, letting the optical signal pass a second time through the diffracting structure 42 may allow to arrange the optical receiver 24 next, adjacent or in close proximity to the optical emitter 22 such that both, the optical receiver 24 and the optical emitter 22 may be arranged opposite the reflective surface 16. This may allow for a small device.

The diffracting structure 42 may be, for example, a diffraction grating, a grid or the like and may be implemented to generate a two-dimensional pattern of the reflected optical signal 26. The receiving elements 24 may be arranged so as to detect the two-dimensional pattern such that the control unit 32 may relate the control pattern with the acoustic signal 34.

In other words, FIG. 2 shows a configuration according to which the chip/package is placed on the PCB.

Figure 3:
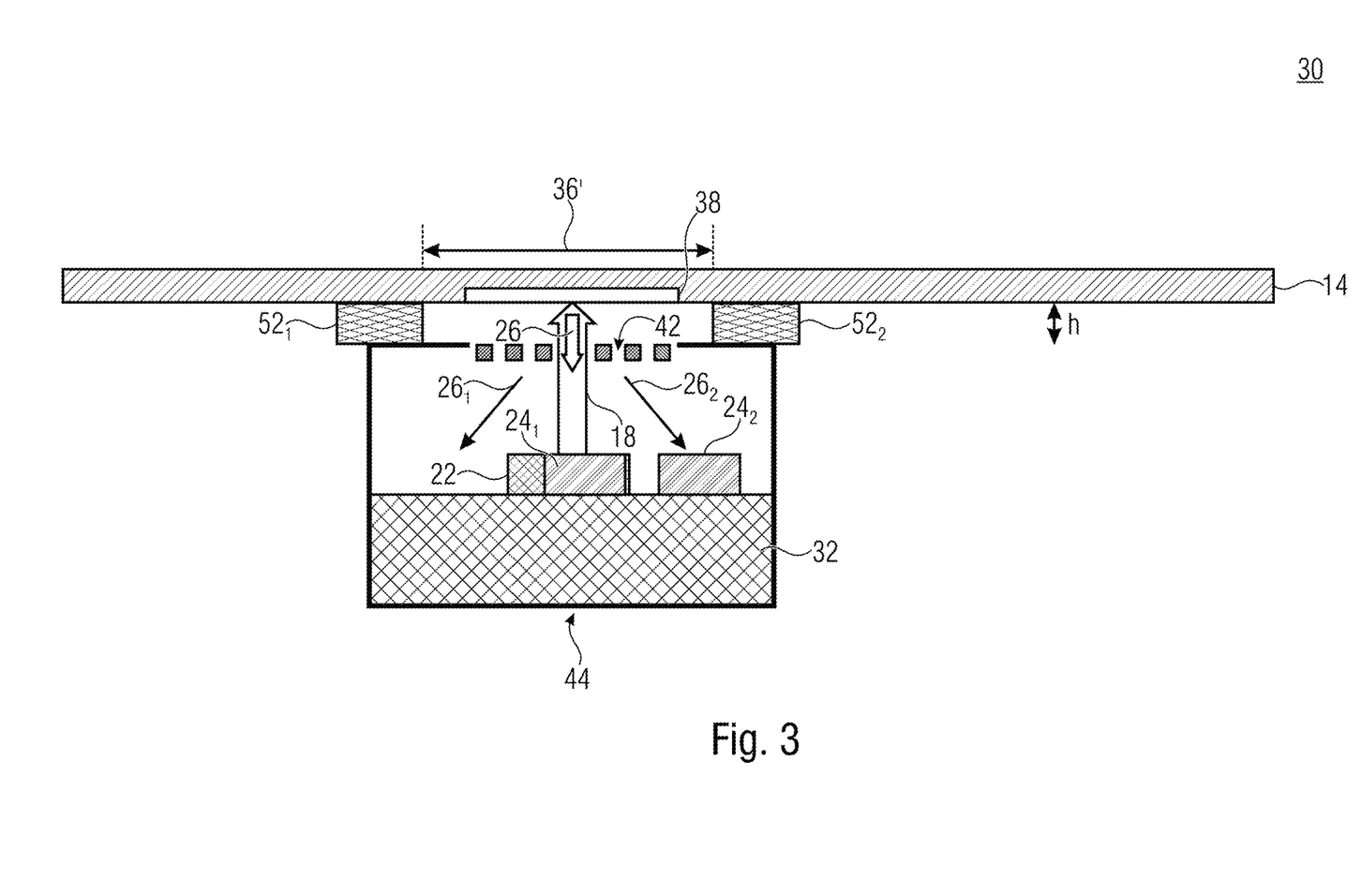
FIG. 3 shows a schematic side view of a part of a device according to an embodiment, wherein the package is attached to the deflectable element.

FIG. 3 shows a schematic side view of a part of a device 30 according to an embodiment. When compared to the device 20, the package 44 may be attached to the deflectable element 14 by use of one or more, possibly circumferentially arranged spaces 521 and/or 522. The one or more spaces 521 and 522 may provide for a fixed distance h between the deflectable element 14 and the package 44 in a range of the spaces 521 and 522. When compared to the device 20, the same package 44 may lead to a smaller vibrating area 36' when compared to the vibrating area 36 but may, in contrast, allow for attaching the package 44 without the use of an opposing substrate. The spaces 521 and/or 522 may comprise any suitable material, e.g., wood, plastic, metal, semi-conductor material or the like. The spaces 521 and/or 522 may be combined with a fixture, for example, an adhesive or the like so as to keep the package 44 attached to the deflectable element 14. That is, the package 44 may mechanically be connected to a side of a housing of the device 30, the side of the housing comprising the reflective surface 16. The reflective surface 16 may be vibratable with respect to the substrate in the vibrating area 36'.

The devices 10, 20 and/or 30 may be implemented as a mobile communication device, for example, a mobile phone, a tablet computer or the like, in which the deflectable element 14 forms a part of a casing or of a screen of the device. The deflectable element 14 may act as a membrane of a microphone, in particular, an optical microphone. The control unit 32 may be configured to read out the microphone.

Devices 10, 20 and/or 30 allow to substitute an acoustic sound port and may thus allow to substitute an opening in a casing through which the sound enters. Using an optical microphone as described in connection with the embodiments described herein allows for high signal quality when compared to attempts being based on a signal transfer between several media which results in multiple loss. Such a configuration would be obtained, for example, by simply blocking an existing acoustic port. Examples for such a multiple transfer is a first transfer between the air, the outside of the casing, to the phone case/glass, a second transfer from the phone case/glass to air in an acoustic channel, e.g., in an interior of the casing and a third loss in an acoustic channel to the MEMS microphone arranged inside the casing. When compared to such a concept, embodiments allow to measure the movement of the phone casing directly. This movement may be measured with an optical microphone.

Removing the acoustic sound port may to remove a weak point in view of water protection and dust protection. Further, it provides for an additional degree of freedom which is not only related to design but also to an arrangement or usage of further technical components in or at the casing. Embodiments allow to support generation of tight cases together with measures for a wireless charging, Bluetooth headsets, wireless connections to loudspeakers and eSIM (embedded subscriber identity module) instead of a sim card. Embodiments allow to remove the microphone acoustic port whilst retaining acoustic performance.

In other words, FIG. 3 shows a configuration according to which the chip/package is placed on the glass.

In other words, for example, smart phone vendors may have an interest in sealing devices to the external environment. Based thereon, for example, headphone jacks may be removed, as Bluetooth® allows headphone connection. Wireless charging enables removal of the charging port. Embodiments may use a small laser source (optical emitter) and an optical diode (optical receiver) to measure the deflection of a MEMS surface when it is exposed to incoming acoustic signals. Embodiments may allow to remove the MEMS and use a specially prepared area of a smart phone screen to measure. The preparation may be implemented by adding the reflective area. The optical microphone may be mounted to the back of the screen glass of the smartphone. Embodiments are related to measure the deflection of the screen in the presence of an acoustic signal. The screen glass may be prepared to provide a correct reflection and to provide deflection to an incoming signal. A glass material as used for smart phone screens may transmit audio signals in low frequencies such that there is a deflection based on an acoustic signal allowing transmission of the acoustic wave. By measuring the deflection of the screen itself, the sensitivity of the optical microphone may be high when compared to having a path to a MEMS microphone with multiple losses. This results in a high SNR. As the microphone may comprise an optical design, there may be no need to mount it in an acoustically isolated way. That is, removing the acoustic microphone port hole may have many advantages. Amongst them, there is a simplification of the industrial design of the smartphone housing and/or of the production thereof. Further, full water and dust proofing of the smartphone may be obtained. Further, by omitting a MEMS microphone, issues of MEMS damage due to compressed air may also be solved.

An optical sensing of the microphone screen may allow for the screen sensitive area to define the microphone performance. A sensitive area much larger than a MEMS membrane area may be implemented. Optical sensing may be a low noise sensing option when compared to MEMS microphones. Optical sensing may also be suited to detect very small deflections and thus low amplitude acoustic signals.

Embodiments related to a method of sensing may comprise:

Using the smartphone display glass as an acoustic sensor to detect incoming sound waves.

The glass backside has a reflective coating to allow sensing using optical methods.

The glass vibrates in response to incoming acoustic pressure signals.

The optical sensing method may make use of optical technology, measuring interference patterns, generated by an optical beam passing through a diffraction grating.

Example open top packages may comprise a laser diode to emit a laser, photodiodes to detect the reflected, diffracted light beams, an ASIC to control the laser and photo receptors to condition the output signal, an opening in the top of the package to allow the light to escape and a diffraction grating in the opening to diffract the reflected light. The distance from the package lid (h) to the diffraction grating may be inferred by the level of the photo receptors output.

One mounting method may be to attach to a specially prepared area of the screen. The attachment may include a window of mechanically undimmed or low dimmed screen area, which is measured by the optical sensor. This method allows for a tightly defined vibrating area and a smaller and tighter defined air gap between grating and screen. On the other hand, this method may lead to a smaller vibrating area. As shown in FIG. 2, the package can also be mounted on a substrate below the smartphone screen, allowing the entire screen area to vibrate, or a defined area controlled by the screen design. This may make use of a larger gap from grating to screen and may allow for much greater variations in this parameter when compared to the embodiment of FIG. 3.

Embodiments enable an acoustic pickup through the inherent vibration of a suspended screen area.

Although some embodiments relate to a sensor arrangement for detecting acoustic signals, alternative embodiments related to a mechanical motion sensor, for example, a weighting device.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A device for sensing a motion of a deflectable surface, the device comprising:
   a deflectable element, having a first side being deflectable and comprising a reflective surface at a second side of the deflectable element, opposing the first side, wherein the first side is an external surface of the device;
   an optical emitter configured for emitting an optical signal towards the reflective surface;
   an optical receiver configured for receiving a reflected optical signal from the reflective surface and for providing a reception signal based on the reflected optical signal, wherein the optical receiver comprises a plurality of receiving elements arranged for detecting a two-dimensional pattern of the reflected optical signal; and
   a control unit in communication with the optical receiver and configured for determining information related to the motion of the deflectable element based on the reception signal,
   wherein the optical emitter and the optical receiver are arranged on a top surface of the control unit, and wherein the optical emitter, the optical receiver, and the control unit are arranged inside a single package, wherein an upper surface of the single package comprises a diffracting structure that is unobstructed to the optical signal, and wherein the single package is affixed to the deflectable element by a plurality of spacers,
   wherein the reflective surface is part of an optical microphone including the optical emitter, the optical receiver, and an optical sound port including the deflectable element, wherein the optical microphone has no hole in the single package to function as an acoustical sound port of the optical microphone,
   wherein the deflectable element is integrated into a cover portion of the device forming the external surface.

2. The device for sensing the motion of the deflectable surface according to claim 1, wherein the deflectable element is implemented such that the first side is deflected based on an acoustic signal, wherein the control unit is configured for determining the information related to the motion so as to relate to the acoustic signal.

3. The device for sensing the motion of the deflectable surface according to claim 1, wherein the reflected optical signal is reflected and deflected with respect to the optical signal.

4. The device for sensing the motion of the deflectable surface according to claim 1,
   wherein the diffracting structure is arranged along an optical path between the optical emitter and the reflective surface, and between the reflective surface and the optical receiver such that the optical path passes through the diffracting structure towards the reflective surface and towards the optical receiver, and
   wherein the optical receiver is arranged next to the optical emitter, opposite the reflective surface.

5. The device for sensing the motion of the deflectable surface according to claim 1, wherein the deflectable element is part of a housing of the device, wherein the reflective surface is arranged at an inner surface of the housing.

6. The device for sensing the motion of the deflectable surface according to claim 1, wherein the deflectable element is part of a screen of the device, wherein the reflective surface is arranged at an inner surface of the screen.

7. The device for sensing the motion of the deflectable surface according to claim 1, wherein the optical emitter and the optical receiver are part of the single package, the single package comprising an optical section, wherein the optical emitter is configured for emitting the optical signal through the optical section.

8. The device for sensing the motion of the deflectable surface according to claim 7, wherein the diffraction structure comprises a diffraction grating in the optical section such that an optical path having a first section from the optical emitter to the reflective surface and a second section from the reflective surface to the optical receiver passes the diffraction grating in the first section and in the second section.

9. The device for sensing the motion of the deflectable surface according to claim 1, being implemented as a mobile communication device, wherein the deflectable element forms a part of a casing or of a screen of the mobile communication device and acts as a membrane of the optical microphone.

10. The device for sensing the motion of the deflectable surface according to claim 1, wherein the optical emitter is a narrow-band emitter.

11. The device for sensing the motion of the deflectable surface according to claim 1, wherein a first receiving element of the plurality of receiving elements is located underneath a center portion of the reflective surface, and wherein a second receiving element of the plurality of receiving elements is laterally spaced apart from the first receiving element.

12. The device for sensing the motion of the deflectable surface according to claim 1, wherein the control unit comprises an application specific integrated circuit.

13. A communication device comprising:
a glass screen covering at least a portion of an external surface of the communication device, wherein the glass screen includes a deflectable element having a first side comprising a portion of the external surface and a second side opposite the first side comprising a reflective surface, wherein the deflectable element is enabled to mechanically deflect in response to being exposed to sound waves at the external surface;
an optical emitter enabled to emit light towards the reflective surface, the reflective surface enabled to reflect reflected light in response to the light;
an optical receiver configured for receiving the reflected light from the reflective surface and for providing a reception signal based on the reflected light, wherein the optical receiver comprises a plurality of receiving elements arranged for detecting a two-dimensional pattern of deflection caused by the sound waves; and
a control unit in communication with the optical receiver and configured for continuously determining information related to motion of the deflectable element based on the reception signal,
wherein the optical emitter and the optical receiver are arranged on a top surface of the control unit, and wherein the optical emitter, the optical receiver, and the control unit are arranged inside a single package, wherein an upper surface of the single package comprises diffracting structure that is unobstructed to the light, and wherein the single package is affixed to the deflectable element by a plurality of spacers,
wherein the communication device is enabled for network communications.

14. The communication device according to claim 13, wherein the diffraction structure comprises a diffraction grating such that an optical path having a first section from the optical emitter to the reflective surface and a second section from the reflective surface to the optical receiver passes the diffraction grating in the first section and in the second section.

15. The communication device according to claim 13, wherein the glass screen further covers a display device.

16. The communication device according to claim 13, wherein the glass screen further comprises at least one touch sensor separate from the deflectable element.

17. A handheld device comprising:
a glass screen covering at least a portion of an external surface of the handheld device, wherein the glass screen includes a deflectable element having a first side comprising a portion of the external surface and a second side opposite the first side comprising a reflective surface, wherein the deflectable element is enabled to mechanically deflect in response to being exposed to sound waves at the external surface;
an optical emitter enabled to emit light towards the reflective surface, the reflective surface enabled to reflect reflected light in response to the light;
an optical receiver configured for receiving the reflected light from the reflective surface and for providing a reception signal based on the reflected light, wherein the optical receiver comprises a plurality of receiving elements arranged for detecting a two-dimensional pattern of deflection caused by the sound waves; and
a control unit in communication with the optical receiver and configured for continuously determining information related to motion of the deflectable element based on the reception signal,
wherein the optical emitter and the optical receiver are arranged on a top surface of the control unit, and wherein the optical emitter, the optical receiver, and the control unit are arranged inside a single package, wherein an upper surface of the single package comprises an unobstructed diffracting structure, and wherein the single package is affixed to the deflectable element by a plurality of spacers,
wherein the handheld device is configured for handheld operation by a human user.

18. The handheld device according to claim 17, wherein the glass screen further comprises at least one touch sensor separate from the deflectable element.

19. The handheld device according to claim 17, wherein the optical emitter and the optical receiver are part of the single package, the single package comprising an optical section, wherein the optical emitter is configured for emitting the optical signal through the optical section.

20. The handheld device according to claim 19, wherein the diffraction structure comprises a diffraction grating in the optical section such that an optical path having a first section from the optical emitter to the reflective surface and a second section from the reflective surface to the optical receiver passes the diffraction grating in the first section and in the second section.

* * * * *

UNITED STATES PATENT AND TRADEMARK OFFICE
CERTIFICATE OF CORRECTION

| | | |
|---|---|---|
| PATENT NO. | : 12,133,050 B2 | Page 1 of 1 |
| APPLICATION NO. | : 15/931965 | |
| DATED | : October 29, 2024 | |
| INVENTOR(S) | : Darragh Francis Corrigan | |

It is certified that error appears in the above-identified patent and that said Letters Patent is hereby corrected as shown below:

In the Claims

In Column 10, Line 58, Claim 19:
Change "the optical signal through the optical section"
To --an optical signal through the optical section--

Signed and Sealed this
Seventh Day of January, 2025

Derrick Brent
*Acting Director of the United States Patent and Trademark Office*